United States Patent [19]
Hufford, Jr. et al.
[11] 3,868,249
[45] Feb. 25, 1975

[54] ALLOY FOR ELECTRICAL LEADS

[75] Inventors: Guy Darrell Hufford, Jr., Thousand Oaks; John Leland Teets, Westlake Village, both of Calif.

[73] Assignee: Wilkinson Dental Manufacturing Co., Inc., Westlake Village, Calif.

[22] Filed: Mar. 14, 1974

[21] Appl. No.: 451,001

[52] U.S. Cl. .............................. 75/134 N, 75/165
[51] Int. Cl. .............................. C22c 5/00
[58] Field of Search .............................. 75/134 N, 165

[56] References Cited

UNITED STATES PATENTS

| | | | |
|---|---|---|---|
| 1,169,753 | 1/1916 | Peschko | 75/165 |
| 3,134,671 | 5/1964 | Prosen | 75/165 X |
| 3,495,978 | 2/1970 | Teets et al. | 75/165 |
| 3,679,402 | 7/1972 | Hirschhorn | 75/165 |

FOREIGN PATENTS OR APPLICATIONS

| | | | |
|---|---|---|---|
| 1,026,575 | 4/1953 | France | 75/134 N |

*Primary Examiner*—L. Dewayne Rutledge
*Assistant Examiner*—E. L. Weise
*Attorney, Agent, or Firm*—Pastoriza & Kelly

[57] ABSTRACT

A new alloy for electrical leads normally imbedded in a ceramic base constituting a portion of an electrical component such as a potentiometer, comprises, by weight, substantially 49 percent gold; 16 percent silver; 32.2 percent palladium; and, 1.8 percent ruthenium, the proportions being such as to provide a greatly improved non-brittle relatively less expensive lead wire in which oxidation is substantially avoided even at the firing temperatures of the ceramic base in which the lead is imbedded.

2 Claims, 2 Drawing Figures

ALLOY FOR ELECTRICAL LEADS

This invention relates to alloys and more particularly to an improved alloy for electrical lead wires employed in electrionic circuit components wherein a ceramic base structure constitutes a portion of the component.

BACKGROUND OF THE INVENTION

Electric components of the type with which the leads of the present invention are utilized generally comprise potentiometers, resistors, capacitors, or similar components wherein the lead wires are incorporated in a ceramic base structure. In the manufacture of the components, the lead-in-wires are generally imbedded in the ceramic base structure when the ceramic material is "green" and fired with the ceramic to complete the ceramic base. The firing temperature may range from 1,500° to 2,400°F and with certain electrical leads presently employed, there results considerable oxidation of the leads, particularly about the lead-in end portions to the ceramic base. Accordingly, it is necessary to clean this oxidized layer from the leads after the ceramic base has been formed. This operation is time consuming and expensive from a labor standpoint.

In addition to the foregoing, many of the alloys employed in electrical leads, while relatively economical to produce, are brittle with the result that when the above referred-to cleaning takes place, the leads will often break off at the base portions of the ceramic structure resulting in a useless part. In fact, the number of rejects involved in the mass production of ceramic base structures with leads extending therefrom has been as high as 50 percent to 60 percent. Even for those leads in which proper cleaning can be achieved, the leads themselves are oftentimes difficult to solder or weld simply as a consequence of the particular alloy employed. Further, storage of the ceramic structures with the leads extending therefrom over long periods of time will result in oxidation of the leads necessitating a second cleaning operation prior to assembly of the structure in a given circuit.

In our U.S. Pat. No. 3,495,978 issued Feb. 17, 1970 there is disclosed and claimed a vastly improved alloy for electrical leads in which the foregoing problems are substantially overcome. More particularly the alloy in our previous patent comprised substantially 65 percent gold, 33.25 percent palladium and 1.75 percent ruthenium by weight.

While the above alloy has been highly successful, the quantity of gold involved renders it relatively expensive. An additional factor determining the cost is the ratio of a length of wire of given diameter to its weight. If this ratio can be increased, the cost per unit length can be reduced.

BRIEF DESCRIPTION OF THE PRESENT INVENTION

Bearing the foregoing considerations in mind, it is a primary object of the present invention to provide an improved alloy for electrical leads wherein the problems mentioned heretofore are overcome and yet which is less expensive than the alloy set forth in the above mentioned U.S. Pat. No.

Briefly, these and other objects and advantages of this invention are attained by providing an alloy for the electrical leads including, by weight, from 44 percent to 54 percent gold; 11 percent to 21 percent silver;

27.2 percent to 37.2 percent palladium and from 0.8 percent to 2.8 percent ruthenium. The inert properties of gold and platinum group metals provide a lead structure wherein oxidation is substantially eliminated. The provision of silver permits a reduction of the amount of gold without adversely affecting the alloy. The proportion of ruthenium controls the brittleness of the leads and will provide the necessary strength and yet avoid a degree of brittleness characteristic of prior electrical leads to the end that rejects of finished parts are substantially reduced in number.

By substituting silver for a proportion of the gold making up the alloy of our heretofore mentioned U.S. Pat. No. 3,495,978 two advantages accrue:

First, reduction in the amount of gold results thereby reducing the overall cost of the alloy per unit weight;

Second, the new alloy utilizing the silver results in an increased ratio of length of wire of given diameter to weight so that a further significant decrease in cost per unit length is realized.

BRIEF DESCRIPTION OF THE DRAWINGS

A better understanding of the invention will be had by now referring to the accompanying drawings, in which.

Figures 1, 2:
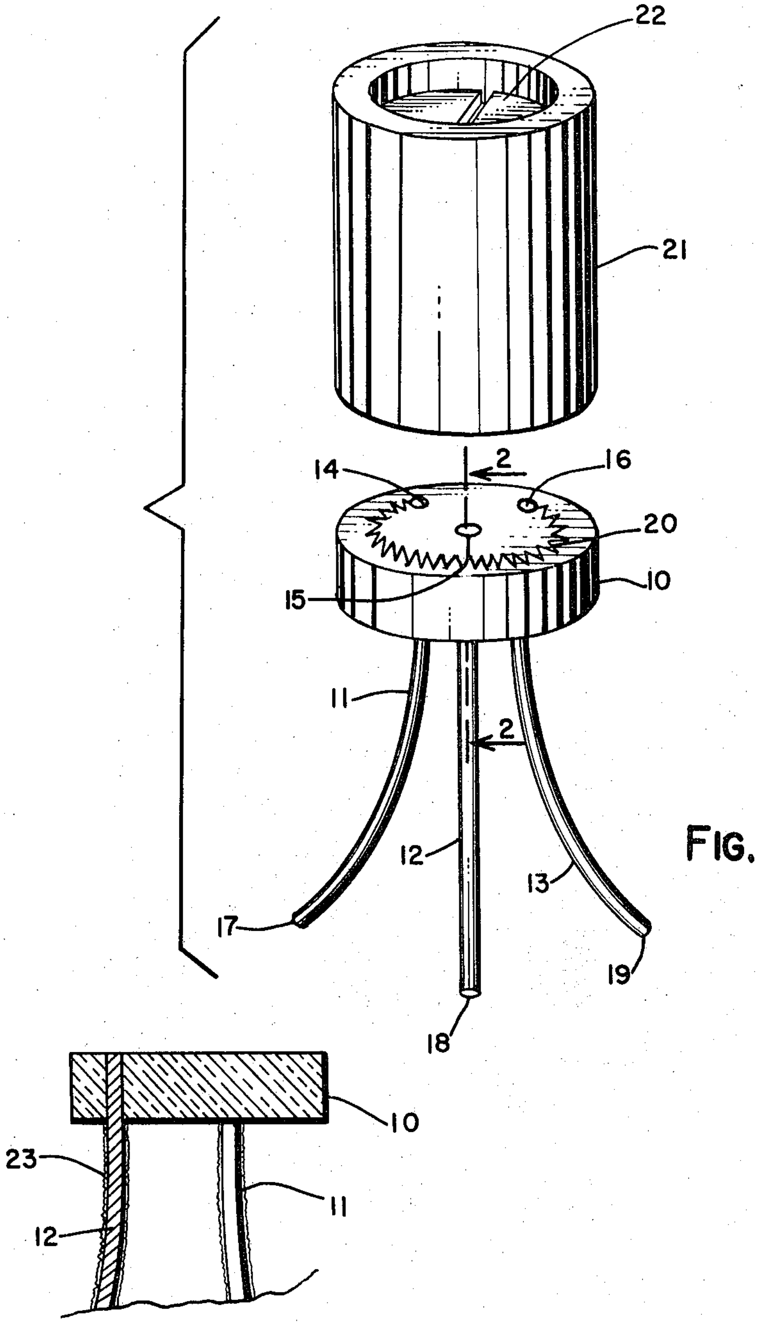
FIG. 1 is an exploded perspective view of a potentiometer circuit component incorporating a ceramic base with electrical leads extending therefrom; and, FIG. 2 is a fragmentary cross section of the ceramic based taken in the direction of the arrows 2—2 of FIG. 1.

Referring first to FIG. 1 there is shown a ceramic base 10 incorporating a plurality of leads 11, 12 and 13 extending from the lower portion of the base 10. First end portions of the leads are imbedded in the ceramic base 10 and have upper exposed contact surfaces 14, 15, and 16 respectively as shown in FIG. 1. The other ends of the leads extend away from the base and terminate in free end portions 17, 18, and 19 for subsequent soldering or welding to auxiliary components.

The particular electrical device illustrated in FIG. 1 constitutes a potentiometer. In this particular device, the potentiometer resistance actually constitutes a printed circuit portion in the form of an arc of a circle 20 "painted" or "printed" directly on the upper surface of the ceramic base 10 connecting two of the exposed contact surfaces 14 and 16 as shown. Cooperating with this structure is a casing 21 incorporating a suitable wiper arm and wiper arm set screw, the upper portion of which can be partially seen at 22 in FIG. 1. The casing 21 fits directly over the ceramic base 10 to provide a complete unit. The potentiometer wiper arm forms no part of the present invention and is therefore not described in detail.

In the manufacture of these potentiometer components, the ceramic base 10 with the leads 11, 12 and 13 imbedded therein constitute a first stage of the manufacture, the first end portions of the lead being imbedded in the ceramic 10 when in a green state. The ceramic is then fired at temperatures ranging from 1,500° to 2,400°F and it is during this firing operation that certain conventional leads become seriously oxidized thereby necessitating the heretofore referred-to cleaning operation after the firing is complete.

For example, with reference to FIG. 2, there is illustrated on the lead 12 imbedded within the ceramic base 10 an oxidation coating 23 which is particularly prominent at the junction point of the lead entering the ceramic structure. This coating 23 must be cleaned from the leads and it is during this cleaning operation that the leads often break at the entrance point to the ceramic base 10.

In accord with the present invention, the electrical leads are formed from an alloy including, by weight, from 44 percent to 54 percent gold; 11 percent to 21 percent silver; 27.2 percent to 37.2 percent palladium; and from 0.8 percent to 2.8 percent ruthenium.

The preferred proportion for the alloy consists by weight, of substantially 49 percent gold; 16 percent silver; 33.2 percent palladium and 1.8 percent ruthenium. As mentioned heretofore, the brittleness of the alloy is determined in large part by the proportion of ruthenium in the alloy. By making this proportion relatively small as indicated, the leads are sufficiently non-brittle that the risk of breakage of the leads at their entrance point to the ceramic base is substantially decreased. Moreover, and as also mentioned heretofore, the particular alloy in question results in substantially no oxidation even during firing of the ceramic with the beneficial result of the avoidance of any lengthy cleaning operation of the leads after the ceramic base structure has been fired.

It should be noted that the avoidance of having to clean the leads also avoids the necessity of handling the leads which contributed heretofore towards breakage of the leads from the base. Further, the non-oxidizing properties of the alloy permit prolonged storage of the auxiliary ceramic base component and leads without risk of oxidation.

The provision of silver reduces the heretofore deemed necessary gold content as well as increasing the ratio of length of wire of given diameter to weight thereby providing a less expensive alloy overcoming problems of oxidation than has been available heretofore.

From the foregoing description, it will thus be evident that the present invention has provided an improved alloy for electrical leads wherein all of the various objects are fully realized.

What is claimed is:

1. An alloy for electrical leads for securement in a ceramic base structure and subject to firing of the ceramic base comprising by weight, from 44 percent to 54 percent gold 11 percent to 21 percent silver, 27.2 percent to 37.2 percent palladium, and 0.8 percent to 2.8 percent ruthenium.

2. An alloy for electrical leads for securement in a ceramic base structure and subject to firing of the ceramic base, consisting by weight of substantially 49 percent gold, 16 percent silver, 32.2 percent palladium, and 1.8 percent ruthenium.

* * * * *